United States Patent [19]

Hasenberg et al.

[11] Patent Number: 5,068,867
[45] Date of Patent: Nov. 26, 1991

[54] COUPLED QUANTUM WELL STRAINED SUPERLATTICE STRUCTURE AND OPTICALLY BISTABLE SEMICONDUCTOR LASER INCORPORATING THE SAME

[75] Inventors: Thomas C. Hasenberg, Agoura Hills; William J. Gignac, Ventura, both of Calif.

[73] Assignee: Hughes Aircraft Company, Los Angeles, Calif.

[21] Appl. No.: 439,728

[22] Filed: Nov. 20, 1989

[51] Int. Cl.$^5$ .............................................. H01S 3/19
[52] U.S. Cl. ........................................ 372/45; 357/4; 357/17
[58] Field of Search ................ 372/45, 43, 44; 357/4, 357/17

[56] References Cited

U.S. PATENT DOCUMENTS

| 4,788,688 | 11/1988 | Hasenberg et al. | 372/45 |
| 4,881,235 | 11/1989 | Chinone et al. | 372/45 |
| 4,881,236 | 11/1989 | Brueck et al. | 372/45 |

OTHER PUBLICATIONS

Obsourn et al., "A GaAs$_x$P$_{1-x}$/GaP Strained-Layer Superlattice", Appl. Phys. Lett., 41(21), Jul. 15, 1982, pp. 172-174.
H. Kawaguchi, "Bistability and Differential Gain in Semiconductor Lasers", Japanese Journal of Applied Physics, vol. 21, (1982) Supplement 21-1, pp. 371-376.
I. H. White et al., "Room-Temperature Optically Triggered Bistability in Twin-Stripe Lasers", Electron Lett. (6B), 19, pp. 558-560 (Jul. 1983).
P. Zorabedian et al., "Bistability in Grating-Tuned External-Cavity Lasers", IEEE Journal of Quantum Electronics, vol. QE-23, No. 11, Nov. 1987, pp. 1855-1860.
R. Kolbas et al., "Strained-Layer InGaAs-GaAs-AlGaAs Photo-Pumped and Current Injection Lasers", IEEE J. Quan. Elec., 24, pp. 1605-1613 (Aug. 1988).
A. I. Kucharska et al., "Bistability in Inhomogeneously Pumped Quantum Well Laser Diodes", IEE Proceedings, vol. 135, Pt.J.No. 1, Feb. 1988, pp. 31-33.

Primary Examiner—Georgia Epps
Attorney, Agent, or Firm—V. D. Duraiswamy; W. K. Denson-Low

[57] ABSTRACT

A short-period, strained superlattice structure includes two coupled quantum well layers separated by a barrier layer. The quantum well layers are preferably formed of indium arsenide and are 2 monolayers thick. The barrier layer is preferably formed of gallium arsenide and is 2 to 10 monolayers thick. The quantum well layers have a lattice parameter or constant which is sufficiently different from that of the barrier layer that a permanent strain exists in the surface. The layers are sufficiently thin that they remain in an unrelaxed state, thereby precluding the formation of misfit dislocations. As an alternative, the superlattice structure may include more than two quantum well layers, each adjacent two of which are separated by a barrier layer. As another alternative, a plurality of structures, each including two quantum well layers separated by a barrier laser may be provided, with each structure separated by a gallium arsenide buffer layer on the order of 170 to 204 angstroms thick. Where incorporated into a semiconductor diode layer as an active region, the strained superlattice structure is capable of exhibiting optical bistability.

29 Claims, 2 Drawing Sheets

COUPLED QUANTUM WELL STRAINED SUPERLATTICE STRUCTURE AND OPTICALLY BISTABLE SEMICONDUCTOR LASER INCORPORATING THE SAME

BACKGROUND OF THE INVENTION

1. Field of the Invention

The present invention generally relates to the art of semiconductor optics, and more particularly to a short period, strained-layer superlattice structure including at least two coupled quantum wells, which produces optical bistability when incorporated into a semiconductor laser as an active region thereof.

2. Description of the Related Art

The semiconductor laser, or laser diode, is a device which operates by using stimulated emission to produce a very intense monochromatic coherent light beam. It generally includes a P-N junction in a direct bandgap material which can be used to inject a minority-carrier density that is sufficient to invert the population on one side of the junction. Two opposite sides of the structure are flat and parallel and may be partially coated for increased reflectivity. When the injection level reaches inversion, a spontaneous recombination may emit a photon nearly perpendicular to the reflecting surfaces. This photon in turn can trigger another minority carrier to recombine, yielding a second photon propagating in the same direction due to coherence between stimulated and stimulating photons. As these photons traverse the active region, an avalanching photon emission takes place. Usable radiation is extracted through the reflecting surfaces.

The P-N junction, which constitutes the active region of the device, is sandwiched between two or more layers of material which serve to confine photons produced by stimulated emission and injected charge carriers in the active region. Generally, the confinement layers have a smaller optical index of refraction than the active region, thereby forming an optical waveguide which causes total internal reflection of photons in the active region and propagation of photons through the waveguide perpendicular to the reflecting surfaces in longitudinal and/or transverse modes in accordance with the particular design criteria.

Injection of charge carriers for stimulated emission is accomplished by means of electrode layers formed on the externally facing surfaces of the confinement layers (or intervening substrate/auxiliary layers if provided). A direct current or pulse voltage is applied to the electrode layers in a direction which causes the P-N junction to be forward biased. The confinement layers lave a larger bandgap energy than the active region, thereby enabling charge carrier injection into the active region and preventing the injected carriers from leaving the active region.

Optically bistable semiconductor lasers offer extremely high speed operation, are potentially switchable in the pico-second time scale, and may be employed as optical switches and optical logic gates in optical and optoelectronic integrated circuits. Optical computers are a primary application of this technology, but eventually it could replace many of the present electronic integrated circuits.

Optical bistability is essentially a hysteresis phenomenon in the optical power output vs. injection current curve. The laser has two possible output powers for the same input power (current). These two output powers can be either both above laser threshold or one above and one below it. In the former case, increasing the injection current beyond a first value causes population inversion and stimulated emission which turns the laser on. The laser will remain turned on until the injection current is subsequently reduced to a second value which is significantly below the first value. The difference between the first and second values is the hysteresis or "bistable region" of the laser. The device may be operated as a bistable switch by applying a steady-state injection current which is intermediate between the first and second values, and modulating the steady-state current with relatively small positive and negative switching pulses to turn the laser on and off respectively, or between 2 on states—a low and a high one. Numerous other devices, such as logic gates, latches, limiters, etc. can be constructed using a bistable semiconductor laser as the main element.

Optical bistability in semiconductor lasers has been accomplished in the past by various methods. A primary expedient has been to fabricate one of the electrode layers in a pattern which is separated into conductive and non-conductive areas. The non-conductive areas constitute saturable absorbers which produce optical bistability by means of inhomogeneous excitation. An example of a device of this type in which the contact area is in the form of a segmented stripe is disclosed in a paper by H. Kawaguchi entitled "Bistability and Differential Gain in Semiconductor Lasers", Japanese Journal of Applied Physics, Volume 21 (1982) Supplement 21-1, pp. 371-376. This paper also describes bistability induced by optical injection. Another electrode structure which has been demonstrated to produce optical bistability is a "twin-stripe" configuration reported in a paper entitled "Room-Temperature Optically Triggered Bistability in Twin-Stripe Lasers", by I.H. White et al, Electron Lett. (6B) 19. pp. 558-560 (July 1983).

Another structure which has produced optical bistability is an "external cavity", such as presented in a paper by P. Zorabedian et al entitled "Bistability in Grating-Tuned External-Cavity Lasers", IEEE Journal of Quantum Electronics, Vol. QE-23, No. 11, Nov. 1987, pp. 1855-1860.

The main disadvantage of inhomogeneously pumped bistable lasers (segmented stripe and twin stripe) is that they rely on unconventional contacts which require special processing and reduce the flexibility of the design and the ability to integrate the structure with other devices. Bistable lasers employing external cavities are bulky, and impractical for integration with other devices.

Semiconductor diode lasers employing single quantum well strained layer structures are known in the art as disclosed in "Strained-Layer InGaAs-GaAs-AlGaAs Photopumped and Current Injection Lasers", by R. Kolbas et al, IEEE J. Quant. Elec., 24. pp. 1605-1613 (Aug. 1988). However, the wavelengths attainable with such devices are limited to very small values, due to the thinness of the quantum well.

Semiconductor diode lasers including multiple quantum wells per se are also known in the art. One example is disclosed in U.S. Pat. No. 4,788,688, issued Nov. 29, 1988 to Thomas Hasenberg et al, entitled "HETEROSTRUCTURE LASER". However, the quantum wells in this example are so thick that they behave the same as bulk material.

Another example of a laser diode structure including multiple quantum wells is found in a paper entitled "Bistability in inhomogeneously pumped quantum well laser diodes", by A.I. Kucharska et al, IEE Proceedings, Vol. 135, Pt.J.No.1, Feb. 1988, pp. 31-33. However, optical bistability is achieved by means of inhomogeneous pumping, and the operation as the same as with a structure in which the multiple quantum well active region is replaced with a bulk GaAs active region.

SUMMARY OF THE INVENTION

The present invention provides an improved short-period, strained layer superlattice structure which is especially advantageous for incorporation as an active region in a semiconductor laser diode. Other exemplary applications for the present superlattice structure include its use in an optical detector, buffer layer structure in an integrated circuit device, base region in a bipolar transistor and multiple quantum well structure in an optical modulator.

In accordance with the present invention, a short-period, strained superlattice structure includes two coupled quantum well layers separated by a barrier layer. A quantum well is constituted by a layer of material having a lower bandgap energy relative to the materials on either side of the quantum well layer, whereby charge carriers having relatively low energies tend to be confined in the quantum wells. The quantum well layers are preferably formed of indium arsenide and are 2 monolayers thick. The barrier layer is preferably formed of gallium arsenide and is 2 to 10 monolayers thick. The quantum well layers have a lattice parameter or constant which is sufficiently different from that of the barrier layer that a permanent strain exists in the structure. The layers are sufficiently thin that they remain in an unrelaxed state, thereby precluding the formation of misfit dislocations. As an alternative, the superlattice structure may include more than two quantum well layers, each adjacent two of which are separated by a barrier layer. As another alternative, a plurality of structures, each including two quantum well layers separated by a barrier layer may be provided, with each structure separated by a gallium arsenide buffer layer on the order of 170 to 204 angstroms thick. Where incorporated into a semiconductor diode laser as an active region, the strained superlattice structure is capable of producing optical bistability.

The multiple quantum wells enable lower energy (longer wavelength) optical transitions than single quantum wells, enabling very narrow photoluminescence linewidths in semiconductor lasers, with wavelengths ranging from 8800 angstroms to over 10,000 angstroms utilizing an InAs/GaAs structure. Longer wavelengths are attainable by increasing the number of alternating quantum well and intervening barrier layers. Semiconductor laser diodes operating in this wavelength range are not commercially available at the present time. In addition, the InAs quantum well layers enable low threshold operation and high laser efficiency.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
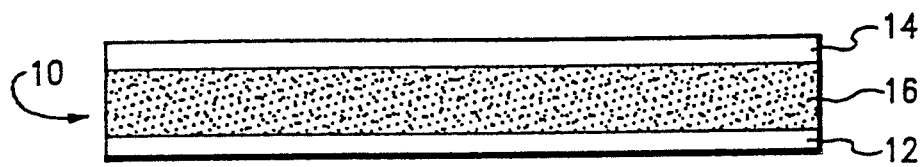
FIG. 1 is a sectional diagram illustrating a strained superlattice structure embodying the present invention.

Referring now to FIG. 1 of the drawing, a short-period, strained superlattice structure embodying the present invention is generally designated as 10 and includes first and second quantum well layers 12 and 14 respectively, with a barrier layer 16 formed therebetween.

The preferred method of fabricating a structure of the invention is molecular beam epitaxy (MBE), since it is capable of forming very thin layers, down to a thickness of one monolayer.

The quantum well layers 12 and 14 may be essentially identical. They are preferably formed of pure, single crystal indium arsenide (InAs), and are two monolayers (equal to one atomic layer or unit cell) thick. Quantitatively, this thickness is approximately 6.6 angstroms. The barrier layer 16 is preferably formed of pure, single crystal gallium arsenide, and is between 2 and 10 monolayers thick, with the preferred value being 5 monolayers. Quantitatively, this thickness is approximately 14 angstroms.

In accordance with an important feature of the present invention, the lattice parameters or constants of the layers 12, 14 and 16 are sufficiently mismatched that a permanent strain exists in the structure 10. The lattice parameter or constant of indium arsenide is 6.058 angstroms, whereas the corresponding value for gallium arsenide is 5.653 angstroms. The lattice mismatch is approximately 7%. It is important that, regardless of the degree of mismatch, the layers 12, 14 and 16 be sufficiently thin so as to remain in an unrelaxed state, with the strain below a critical value above which one or more of the layers would relax and enable the formation of misfit dislocations.

The material of the quantum well layers 12 and 14, in the present example indium arsenide, has a bandgap energy which is lower than that of the barrier layer 16. This is to produce carrier confinement between adjacent quantum wells, as will be described in detail below. The bandgap energy of indium arsenide is 0.35 electron volts, whereas the corresponding value for gallium arsenide is 1.42 electron volts.

It is also important within the scope of the present invention that the barrier layer 16 be sufficiently thin to enable quantum coupling between the adjacent quantum well layers 12 and 14. It is this coupling, in combination with the strain in the superlattice structure 10, that produces optical bistability when the structure 10 is incorporated into a semiconductor laser as an active region thereof. Although InAs/GaAs materials for the quantum well/barrier layer structure have been demonstrated to exhibit the properties necessary for practicing the invention, other material systems including, but not limited to, AlGaAs/GaAs, InGaAsP/InP, InGaAs/InP, or InGaAs/AlInAs may also be found to meet the present requirements.

Figure 2:
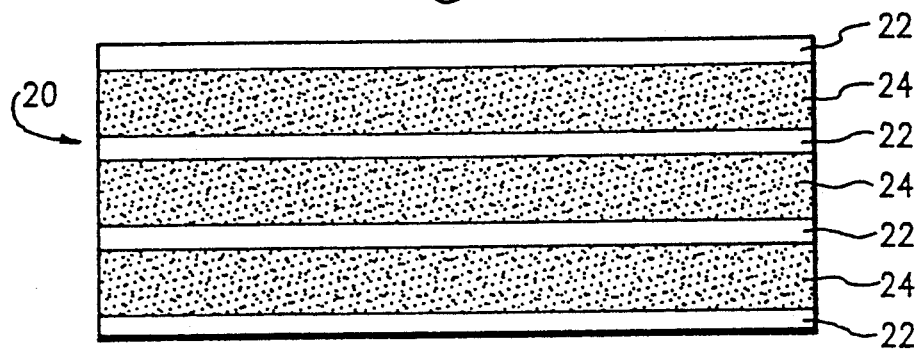
FIGS. 2 and 3 are sectional diagrams illustrating alternative embodiments of strained superlattice structures embodying the present invention.

FIG. 2 illustrates an alternative embodiment of a short-period, strained superlattice structure embodying the present invention. This structure is generally designated as 20, and includes a plurality of quantum well layers 22, and a barrier layer 24 formed between each two adjacent quantum well layers 22 respectively. The layers 22 and 24 are essentially similar to the corresponding layers in the embodiment of FIG. 1. Theoretically, the alternating structure of layers 22 and 24 may be repeated to any desired value. In practical application, the number of alternating layers is limited by the degree of quantum coupling between the layers 22 which produces a useful result, and the combined critical thickness of the structure 20 as a unit, above which relaxation and misfit dislocation formation would result.

Figure 3:
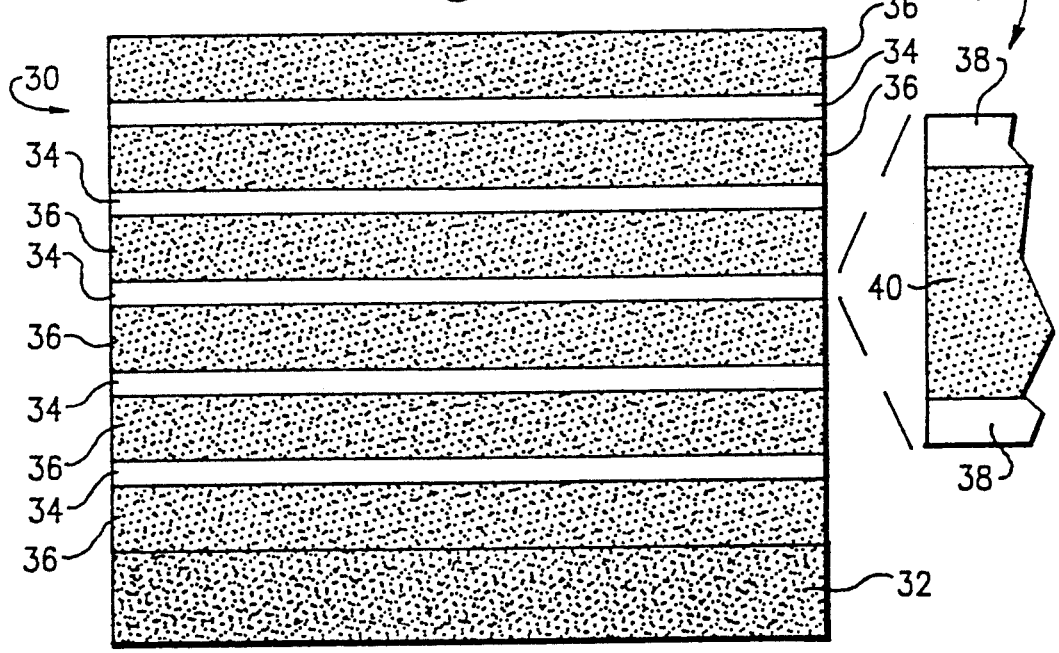

FIG. 3 illustrates another superlattice structure 30 embodying the present invention which comprises a optional substrate 32 formed of, for example, gallium arsenide. It will be understood that the embodiments of FIGS. 1 and 2 may also be formed on substrates and/or include other structural layers, although not illustrated.

The superlattice structure 30 further includes a plurality of quantum well structure units 34, and buffer layers 36 formed between each two adjacent quantum well structure units 34 respectively, formed on the substrate 32. Each quantum well structure unit 34, as illustrated in fragmentary enlarged form in FIG. 3, includes two quantum well layers 38 separated by a barrier layer 40 in an essentially similar manner as in the structure shown in FIG. 1. It will be understood, however, that each quantum well structure unit 34 may alternatively have the configuration shown in FIG. 2 or 3.

The buffer layers 36 are preferably thicker than the quantum well structure units 34, and may be formed of gallium arsenide with a thickness on the order of 170 to 204 angstroms. The purpose of the buffer layers 36 is to absorb strain, while enabling the number of quantum well structure units 34 to be increased to a desired value. A practical limit to the number of layers which may be provided is determined by the critical thickness of the entire superlattice structure 30 above which strain relaxation and misfit dislocations would result.

Figure 4:
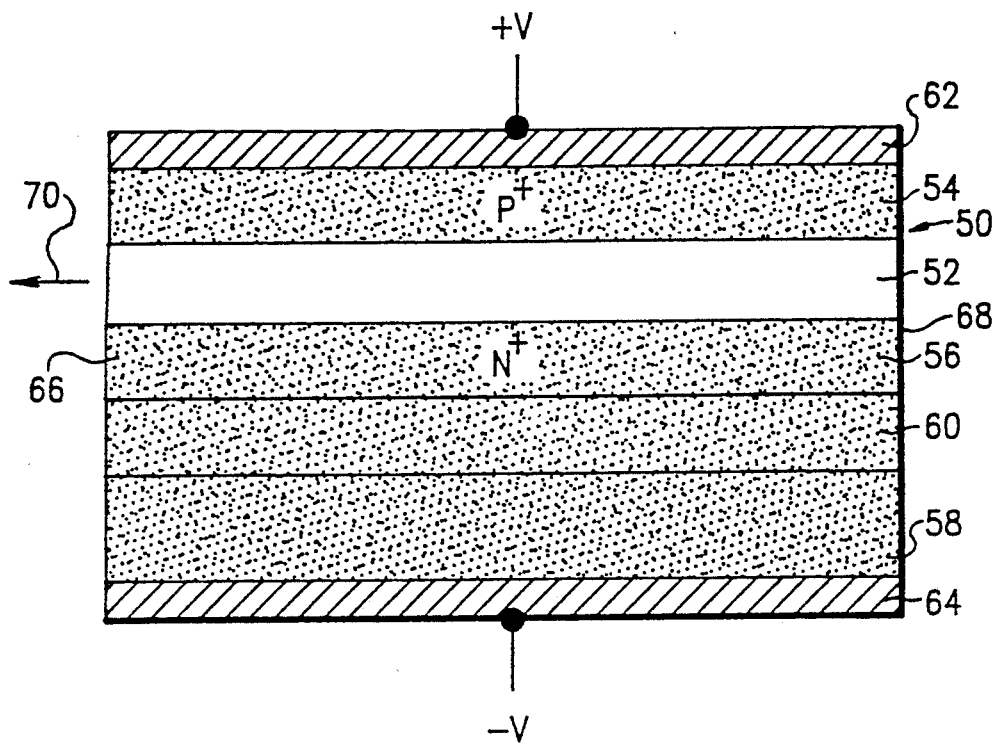
FIG. 4 is a sectional diagram illustrating a semiconductor diode laser incorporating a strained superlattice structure of the invention as an active region thereof.

FIG. 4 illustrates a semiconductor laser 50 which incorporates any desired one of the strained superlattice structures 10, 20 or 30 illustrated in FIGS. 1 to 3 respectively as an active region 52 thereof. The laser 50 is illustrated as being of the double heterostructure diode type, and includes a P+ doped confinement layer 54 and an N+ doped confinement layer 56 which sandwich the active region 52 therebetween. A substrate 58 supports the layers 52, 54 and 56 via a buffer layer 60 which provides lattice matching and strain absorption. Ohmic electrode contact layers 62 and 64 are formed on the externally facing surfaces of the confinement layer 54 and substrate 58 respectively. A direct current or pulse voltage is applied to the laser 50 which renders the contact layer 62 positive with respect to the contact layer 64, thereby forward biasing the diode structure. It will be noted that the contact layers 62 and 64 are substantially coextensive with the active region, as opposed to striped and segmented laser configurations of the prior art.

The confinement layers 54 and 56 are formed of a material such as gallium arsenide which has a higher bandgap energy and also a lower optical index of refraction than the quantum well layers in the active region 52. This creates an optical waveguide effect which causes total internal reflection of photons generated in the active region 52 and the formation of longitudinal and/or transverse optical modes therein. With the bandgap energy of the confinement layers 54 and 56 higher than that of the quantum well layers in the active region 52, charge carriers may be easily injected through the confinement layers 54 and 56 into the active region 52, but are prevented from leaving the region 52. Opposite, parallel reflecting edges 66 and 68 of the laser 50 are cleaved on natural crystallographic planes and may be partially silvered.

The contact layer 62 is typically formed of gold mixed with a 2% beryllium concentration. The upper confinement or "clad" layer 54 may be a 2.5 micron thick layer of gallium arsenide doped with beryllium to a concentration of $10^{17}$. The lower confinement or "clad" layer 56 is typically a one micron thick layer of gallium arsenide doped with silicon to a concentration of approximately $5 \times 10^{17}$. The buffer layer 60 may also be gallium arsenide doped with silicon to a concentration of 2 to $5 \times 10^{18}$. The substrate 58 is typically a 100 micron thick layer of gallium arsenide doped with silicon to a concentration of $2 \times 10^{18}$. The contact layer 64 is typically a gold/germanium alloy plus nickel and then pure gold.

In operation, positive and negative charge carriers are injected through the confinement layers 54 and 56 respectively into the active region 52. The level of carrier injection is such that carrier population inversion and stimulated photon emission are created in the active region 52. This causes regenerative photon emission (optical gain) and the generation of a longitudinal and/or transverse optical wave which is reflected back and forth between the reflecting layers 66 and 68 until sufficient optical power is attained to enable a beam to emerge from the laser 50 in the direction of an arrow 70. The optical wave is confined to the active region 52 by the confinement layers 54 and 56 as described above.

Figure 5:
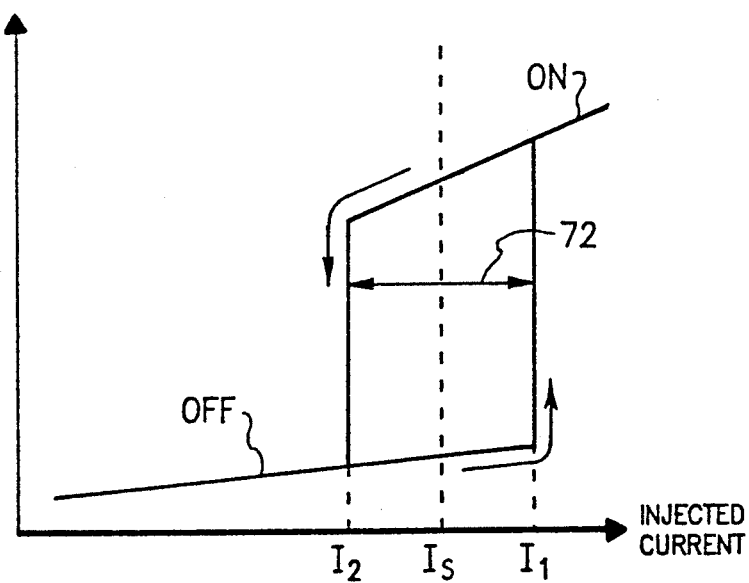
FIG. 5 is a graph illustrating the operation of the laser semiconductor diode laser shown in FIG. 4.

The short-period, strained superlattice structure incorporated as the active region 52 of the semiconductor laser 50 produces optical bistability as illustrated in FIG. 5, which plots optical power output as a function of injected electrical current. The optical power may be equivalently expressed as light intensity or energy, whereas the injected current may be equivalently expressed as electrical power. The shape of the curve is the same in all cases, and illustrates an optically bistable region 72 which is the result of the strain and/or the coupling between quantum well layers in the strained superlattice structure of the invention.

As the electric current injected into the active region resulting from the voltage applied across the electrode contact layers 62 and 64 is increased from zero, the laser 50 produces a very low level of optical power output. This condition is designated as the OFF state of the laser 50, and is represented by a gradually upward sloping line at the lower portion of the figure.

As the injected current is increased above a first value $I_1$, the level of stimulated emission in the active region 52 becomes sufficient to overcome all absorptive losses in the laser 50, and the optical power output increases in a stepwise manner to an ON state which is represented by a line located at the upper portion of the figure having a steeper upward slope. As the injected current is increased above the value $I_1$, the optical power output increases correspondingly as illustrated in the figure.

If the injected current is reduced from a value above $I_1$ to below a second value $I_2$ which is lower than $I_1$ by the width of the bistable region 72, stimulated emission becomes insufficient to overcome absorptive losses, and the laser 50 turns off. The bistable region 72 constitutes a region of hysteresis which makes the laser 50 capable of being utilized in numerous useful configurations such as a high speed bistable optical switch, logic gate, limiter, etc.

The laser 50 may be operated as a bistable optical switch by applying a steady-state injection current $I_s$ thereto which lies in the bistable region 72, midway between the ON and OFF values $I_1$ and $I_2$ respectively. Under this condition, the laser 50 may be either on or off depending on the history of the injected current. Modulation of the current $I_s$ with a positive pulse having a magnitude of at least $(I_1-I_2)/2$ will unconditionally turn on the laser 50. Similarly, modulation with a negative pulse of the same magnitude will unconditionally turn off the laser 50.

The present semiconductor laser can be designed to emit light at a desired wavelength through selection of the thickness of the quantum well and barrier layers and the number of repetitions thereof. As a general design criteria, increasing the thickness of the quantum well layers will increase the wavelength.

The exact mechanism by which the present strained layer superlattice structure produces optical bistability when incorporated into a semiconductor diode laser as the active region thereof is not understood at the present time. It is known that the strain in the superlattice structure causes the bandgap in the indium arsenide quantum well layers to increase while the bandgap in the intervening gallium arsenide barrier layer decreases, which causes the emission and absorption regions to overlap. It is also known that the wave functions of the quantum well layers are interactively coupled due to the thinness of the barrier layer. Resonant and nonresonant tunneling from one well to the adjacent well are likely to occur since the barriers are so thin. The probability of this tunneling is input dependent since changing the input current changes the electric field across the quantum wells. In addition, photons generated in the quantum well layers are partially absorbed by the barrier layer. However, this absorption is saturable due to the thinness and band structure of the barrier layer (small effective masses of electrons). It is probable that the optical bistability of the present superlattice structure is the result of a combination of these mechanisms.

The present superlattice structure has been experimentally tested as the active region in a heterostructure laser diode under various conditions. Configurations including 2 and 3 quantum wells were tested and the well and barrier thicknesses were varied. Optical bistability was observed with excellent differential quantum efficiency of up to 96%, and very good laser spectra for laser diodes cooled to 80° K.

While several illustrative embodiments of the invention have been shown and described, numerous variations and alternate embodiments will occur to those skilled in the art, without departing from the spirit and scope of the invention. For example, the materials and thicknesses of the superlattice component layers may be modified from the configurations described. Accordingly, it is intended that the present invention not be limited solely to the specifically described illustrative embodiments. Various modifications are contemplated and can be made without departing from the spirit and scope of the invention as defined by the appended claims.

We claim:

1. A strained superlattice structure comprising:
a plurality of coupled quantum well layers; and
a barrier layer formed between each two adjacent quantum well layers respectively;
the quantum well layers having a bandgap energy which is lower than the bandgap energy of the barrier layer;
the quantum well layers having a lattice parameter which is selected to be different from the lattice parameter of the barrier layer such that a permanent strain is created in the quantum well layers and the barrier layer.

2. A strained superlattice structure comprising:
a plurality of coupled quantum well layers; and
a barrier layer formed between each two adjacent quantum well layers respectively;
the quantum well layers having a bandgap energy which is lower than the bandgap energy of the barrier layer;
the quantum well layers having a lattice parameter which is selected to be different from the lattice parameter of the barrier layer such that a permanent strain is created in the quantum well layers and the barrier layer;
wherein the lattice parameter of the quantum well layers is higher than the lattice parameter of the barrier layer.

3. A superlattice structure as in claim 1, in which the quantum well layers and the barrier layer have thicknesses selected such that the quantum well layers and barrier layer remain in an unrelaxed state, thereby precluding formation of misfit dislocations therein, and tunneling will occur between adjacent quantum well layers.

4. A superlattice structure as in claim 1, in which the quantum well layers comprise indium arsenide and the barrier layer comprises gallium arsenide.

5. A superlattice structure as in claim 4, in which the quantum well layers are 2 monolayers thick and the barrier layer is between 2 and 10 monolayers thick.

6. A superlattice structure as in claim 5, in which the barrier layer is substantially 5 monolayers thick.

7. A superlattice structure as in claim 1, comprising two quantum well layers and one barrier layer.

8. A superlattice structure comprising:
a plurality of quantum well structures and a buffer layer formed between each two adjacent quantum well structures;
each quantum well structure comprising two quantum well layers and a barrier layer formed between the quantum well layers;
the quantum well layers having a bandgap energy which is lower than the bandgap energy of the barrier layer and the buffer layer;
the quantum well layers having a lattice parameter which is selected to be different from the lattice parameters of the barrier layer and the buffer layer such that a permanent strain is created in the superlattice structure;
the quantum well layers, barrier layer and buffer layer having thicknesses selected such that the quantum well layers, barrier layer and buffer layer remain in an unrelaxed state, thereby precluding formation of misfit dislocations therein, and tunneling will occur between adjacent quantum well layers.

9. A superlattice structure as in claim 8, in which the quantum well layers comprise indium arsenide, and the barrier layer and buffer layer comprise gallium arsenide.

10. A superlattice structure as in claim 9, in which the quantum well layers are 2 monolayers thick, the barrier layer is between 2 and 10 monolayers thick, and the buffer layer is between 170 and 204 angstroms thick.

11. An optically bistable semiconductor laser including an active region, confinement means for creating an optical waveguide effect in the active region, electrode means for applying a bias voltage to the active region, and a substrate for supporting the active region, confinement means and electrode means, the active region comprising:
   a plurality of coupled quantum well layers; and
   a barrier layer formed between each two adjacent quantum well layers respectively;
   the quantum well layers having a bandgap energy which is lower than the bandgap energy of the barrier layer;
   the quantum well layers having a lattice parameter which is selected to be different from the lattice parameter of the barrier layer such that a permanent strain is created in the quantum well layers and the barrier layer which causes optical bistability.

12. An optically bistable semiconductor laser, comprising:
   an active area which includes:
      a plurality of coupled quantum well layers; and
      a barrier layer formed between each two adjacent quantum well layers respectively;
      the quantum well layers having a bandgap energy which is lower than the bandgap energy of the barrier layer;
      the quantum well layers having a lattice parameter which is selected to be different from the lattice parameter of the barrier layer such that a permanent strain is created in the quantum well layers and the barrier layer which causes optical bistability;
   first and second optical and charge confinement layers which sandwich the active region therebetween;
   first and second electrode layers formed over the first and second confinement layers respectively; and
   a substrate for supporting the active area, first and second confinement layers, and first and second electrode layers.

13. A semiconductor laser as in claim 12, in which the first and second confinement layers are doped with P-type and N-type impurities respectively.

14. A semiconductor laser as in claim 12, in which the first and second electrode layers are substantially coextensive with the active region.

15. A semiconductor laser as in claim 12, in which the substrate is formed between the first confinement layer and the first electrode layer.

16. An optically bistable a semiconductor laser including an active region, confinement means for creating an optical waveguide effect in the active region, electrode means for applying a bias voltage to the active region, and a substrate for supporting the active region, confinement means and electrode means, the active region comprising:
   a plurality of coupled quantum well layers; and
   a barrier layer formed between each two adjacent quantum well layers respectively;
   the quantum well layers having a bandgap energy which is lower than the bandgap energy of the barrier layer;
   the quantum well layers having a lattice parameter which is selected to be different from the lattice parameter of the barrier layer such that a permanent strain is created in the quantum well layers and the barrier layer which causes optical bistability;
   the lattice parameter of the quantum well layers being higher than the lattice parameter of the barrier layer.

17. A semiconductor laser as in claim 11, in which the quantum well layers and the barrier layer have thickness selected such that the quantum well layers and the barrier layer remain in an unrelaxed state, thereby precluding formation of misfit dislocations therein, and tunneling will occur between adjacent quantum well layers.

18. A semiconductor laser as in claim 11, in which the quantum well layers comprise indium arsenide and the barrier layer comprises gallium arsenide.

19. A semiconductor laser as in claim 18, in which the quantum well layers are 2 monolayers thick and the barrier layer is between 2 and 10 monolayers thick.

20. A semiconductor laser as in claim 19, in which the barrier layer is substantially 5 monolayers thick.

21. An optically bistable semiconductor laser including an active region, confinement means for creating an optical waveguide effect in the active region, electrode means for applying a bias voltage to the active region, and a substrate for supporting the active region, confinement means and electrode means, the active region comprising:
   a plurality of quantum well structures and a buffer layer formed between each two adjacent quantum well structures respectively;
   each quantum well structure comprising two quantum well layers and a barrier layer formed between the quantum well layers;
   the quantum well layers having a bandgap energy which is lower than the bandgap energy of the barrier layer and the buffer layer;
   the quantum well layers having a lattice parameter which is selected to be different from the lattice parameters of the barrier layer and the buffer layer such that a permanent strain is created in the active region which causes optical bistability;
   the quantum well layers, barrier layer and buffer layer having thicknesses selected such that the quantum well layers, barrier layer and buffer layer remain in an unrelaxed state, thereby precluding formation of misfit dislocations therein, and tunneling will occur between adjacent quantum well layers.

22. A semiconductor laser as in claim 21, in which the quantum well layers comprise indium arsenide, and the barrier layer comprises gallium arsenide.

23. A semiconductor laser as in claim 22, in which the quantum well layers are 2 monolayers thick, and the barrier layer is between 2 and 10 monolayers thick.

24. A semiconductor laser as in claim 23, in which the buffer layer comprises gallium arsenide and is between 170 and 204 angstroms thick.

25. A semiconductor laser as in claim 21, in which:

the confinement means comprises first and second optical and charge confinement layers which sandwich the active region therebetween; and the electrode means comprises first and second electrode layers formed on the first and second confinement layers respectively.

26. A semiconductor laser as in claim 25, in which the first and second confinement layers are doped with P-type and N-type impurities respectively.

27. A semiconductor laser as in claim 25, in which the first and second electrode layers are substantially coextensive with the active region.

28. A semiconductor laser as in claim 25, further comprising a substrate formed between the first confinement layer and the active region.

29. An optically bistable semiconductor laser including an active region, confinement means for creating an optical waveguide effect in the active region, electrode means for applying a bias voltage to the active region, and a substrate for supporting the active region, confinement means and electrode means, the active region comprising:

a plurality of coupled quantum well layers; and a barrier layer formed between each two adjacent quantum well layers respectively;

the quantum well layers having a bandgap energy which is lower than the bandgap energy of the barrier layer;

the quantum well layers and the barrier layer having thicknesses selected such that the quantum well layers are interactively coupled, and tunneling will occur between adjacent quantum well layers.

* * * * *